(12) United States Patent
Han

(10) Patent No.: US 12,385,778 B2
(45) Date of Patent: Aug. 12, 2025

(54) HYPER-SPECTRAL MULTI-SPOT OPTICAL REFLECTOMETER

(71) Applicant: Applied Materials, Inc., Santa Clara, CA (US)

(72) Inventor: Pengyu Han, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 18/472,531

(22) Filed: Sep. 22, 2023

(65) Prior Publication Data
US 2025/0102356 A1    Mar. 27, 2025

(51) Int. Cl.
*G01J 3/02* (2006.01)
*G01B 11/06* (2006.01)
*H01J 37/32* (2006.01)

(52) U.S. Cl.
CPC ............ *G01J 3/0218* (2013.01); *G01B 11/06* (2013.01); *G01J 3/0208* (2013.01); *G01J 3/0229* (2013.01); *H01J 37/32972* (2013.01)

(58) Field of Classification Search
CPC ...... G01J 3/0218; G01J 3/0208; G01J 3/0229; G01B 11/06
See application file for complete search history.

(56) References Cited

U.S. PATENT DOCUMENTS

| | | | | |
|---|---|---|---|---|
| 7,620,513 B2 * | 11/2009 | Nakayama | ......... | G01M 11/3136 356/73.1 |
| 9,423,316 B2 * | 8/2016 | Perron | ............... | G01M 11/3145 |
| 2022/0148862 A1 | 5/2022 | Lian et al. | | |

* cited by examiner

*Primary Examiner* — Seung C Sohn
(74) *Attorney, Agent, or Firm* — Patterson + Sheridan, LLP

(57) ABSTRACT

An optical reflectometry system, including a processing chamber, a substrate support wherein the substrate support is configured to accept a substrate, a light source configured to transmit an incident light beam, an optical fiber bundle coupled to the light source and optically coupled to a lens assembly, wherein the lens assembly optically coupled to at least a first optical fiber, and configured to transmit to, and receive from, at least one area of the substrate through the transparent window, an optical splitter disposed within the optical fiber bundle; a return fiber bundle coupled to the optical splitter, and coupled to a detection system, wherein the detection system is configured to reference a reference light beam to a reflected light beam to improve a signal-to-noise ratio, analyze a full spectrum of the reflected light beam, and determine at least one characteristic of the at least one area of the substrate.

25 Claims, 7 Drawing Sheets

HYPER-SPECTRAL MULTI-SPOT OPTICAL REFLECTOMETER

BACKGROUND

Field

Embodiments of the present disclosure generally relate to improvements in optical reflectometry for substrate processing systems.

Description of the Related Art

Semiconductor device geometries have dramatically decreased in size since such devices were first introduced several decades ago. The increasing circuit densities have placed additional demands on processes used to fabricate semi-conductor devices. For example, as circuit densities increase, the pitch size decreases rapidly to sub 50 nm dimensions, whereas the vertical dimensions such as trench depth remain relatively constant, with the result that the aspect ratios for the features, i.e., their height divided by width, increases. The open area ratio of the device feature as a percentage of the whole wafer is getting smaller, which yields smaller percentage of light containing the information about feature. At the same time, the features tend to be deeper with a smaller opening, which reduces light coming out from the bottom of the feature, reducing the signal-to-noise (SNR) further.

Precise control of the dimensions of such high density and sub-micron features is critical to the reliable formation of the semiconductor devices. Features, such as transistors and capacitors are conventionally formed in the semiconductor device by patterning a surface of a substrate to define the lateral dimensions of the features and then etching the substrate to remove material and define the features. To form features with a desired electrical performance, the dimensions of the features must be formed within control specifications. Accordingly, it may be necessary to partially remove one or more layers using a dry etching or plasma etching process. For example, for end point detection, the interference fringe pattern can be simulated for various layers and then compared during etching with the measured signal. The method is very effective and can be used to monitor etching and end point detection of substrates with multiple layers on top.

Typically, in-situ optical reflectometers use a fiber optic cable to transmit from light from the reflectometer and receive reflected light from a substrate in a substrate processing chamber. The conventional fiber optic cable can measure parameters such as film quality, film thickness, or a width of structures on a substrate. However, due to the large distance between the lens and the substrate being processed, the effective beam size at the substrate ranges from a few millimeters to over 10 millimeters. The large beam size makes it difficult to focus the beam on the wafer, and the reflected beam contains information from many features on the substrate that are not of interest. This makes target features of interest hard to identify and filter. Accordingly, there is need in the art for improvements to in-situ optical reflectometers.

SUMMARY

Embodiments of the present disclosure generally relate to improvements in optical reflectometry for substrate processing systems.

One general aspect includes an optical reflectometry system. The optical reflectometry system also includes a processing chamber having a ceiling, sidewalls, and a bottom defining an internal volume, where the ceiling contains a transparent window. The system also includes a substrate support located in the internal volume, where the substrate support is configured to accept a substrate. The system also includes a light source located outside of the internal volume configured to transmit an incident light beam. The system also includes an optical fiber bundle located outside of the internal volume may include at least a first optical fiber coupled to the light source and optically coupled to a lens assembly, where the lens assembly is disposed above the transparent window, and optically coupled to at least a first optical fiber, and configured to: transmit to at least one area of the substrate through the transparent window, receive from the at least one area of the substrate through the transparent window; an optical splitter disposed within the optical fiber bundle. The system also includes a return fiber bundle may include at least a first return fiber coupled to the optical splitter and coupled to a detection system, where the detection system is configured to: reference a reference light beam and a reflected light beam to improve a signal-to-noise ratio (snr) for analysis of the reflected light beam, analyze a full spectrum of the reflected light beam, and determine at least one characteristic of the at least one area of the substrate based upon the analysis of the full spectrum of the reflected light beam. Other embodiments of this aspect include corresponding computer systems, apparatus, and computer programs recorded on one or more computer storage devices, each configured to perform the actions of the methods.

One general aspect includes a method of optical reflectometry. The method also includes transmitting, via an optical fiber bundle may include at least a first optical fiber, an incident light beam from a light source to an optical splitter. The method also includes transmitting a first portion of the incident light beam, via the optical fiber bundle, from the optical splitter to a lens assembly. The method also includes transmitting a second portion of the incident light beam as a reference light beam, via a return fiber bundle may include a plurality of return fibers, from the optical splitter to a detection system. The method also includes focusing the first portion of the incident light beam as rays of incident light from the lens assembly upon at least one area of a substrate disposed within a processing chamber. The method also includes receiving rays of reflected light from the at least one area of the substrate at the lens assembly. The method also includes transmitting the rays of reflected light as a reflected light beam from the lens assembly, via the optical fiber bundle, to the optical splitter. The method also includes transmitting the reflected light beam from the optical splitter, via the return fiber bundle, to the detection system. The method also includes determining at least one characteristic of the at least one area of the substrate. Other embodiments of this aspect include corresponding computer systems, apparatus, and computer programs recorded on one or more computer storage devices, each configured to perform the actions of the methods.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Examples of the present disclosure generally relate to improvements in optical reflectometry for substrate processing systems.

Figure 1:
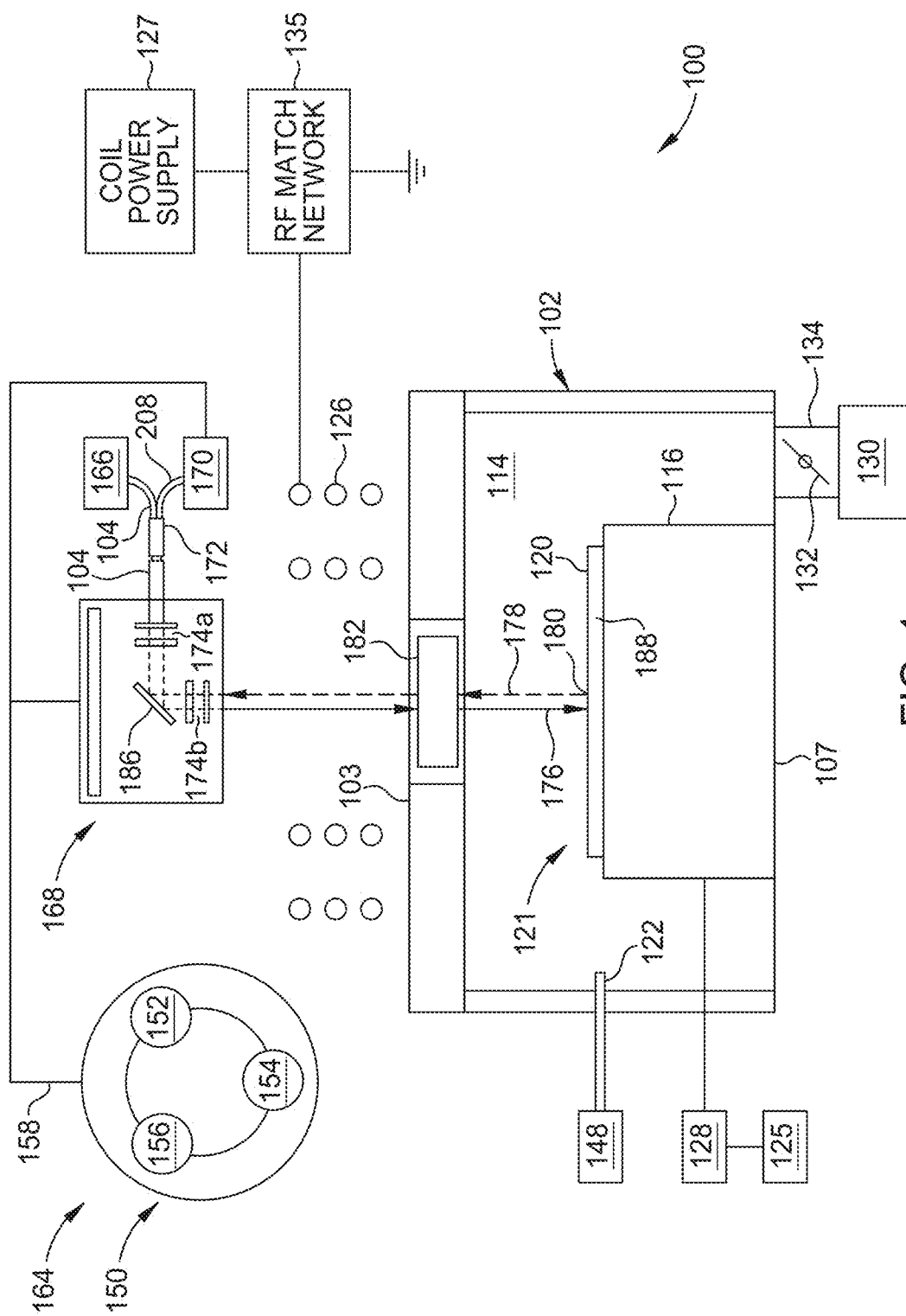
FIG. 1 is a schematic cross sectional view of an example plasma processing chamber having a detection system, in accordance with one example of the disclosure.

FIG. 1 is a schematic cross sectional view of an example processing chamber 100 from a substrate processing system, having a detection system 164, in accordance with one example of the disclosure. Suitable processing chambers include inductively and capacitive coupled plasma etch chambers such as the TETRA® photomask etch system and the SYM3® etch system, both available from Applied Materials, Inc., of Santa Clara, California, among others. Other types of processing chambers may be adapted to benefit from the invention, including, for example, capacitive coupled parallel plate chambers, and magnetically enhanced ion etch chambers, as well as inductively coupled plasma etch chambers.

The processing chamber 100 includes a chamber body 102 and a ceiling 103 that is energy transparent, i.e., enabling energy and light to be transmitted therethrough. The chamber body 102, has sidewalls, a ceiling 103, and also has a chamber bottom 107. The chamber body 102, sidewalls, ceiling 103, and chamber bottom 107 define an internal volume of the processing chamber 100. The chamber body 102 is fabricated from a metal, such as anodized aluminum or stainless steel. The ceiling 103 is mounted on the chamber body 102. The ceiling 103 may be flat, rectangular, arcuate, conical, dome, or multi-radius shaped. The ceiling 103 is fabricated from an energy transparent material such as a ceramic or other dielectric material. An inductive coil 126 is disposed over the ceiling 103 of the processing chamber 100, and is utilized to energize gases within the processing chamber 100 during processing.

A substrate support 116 is disposed in the processing chamber 100 having a substrate support surface 188 to support a substrate 120 during processing. The substrate support 116 may include an electrostatic chuck, with at least a portion of the substrate support 116 being electrically conductive and capable of serving as a process bias cathode.

Processing gases are introduced into the processing chamber 100 from a process gas source 148 through a gas distributor 122. The gas distributor 122 may be disposed in the ceiling 103 or chamber body 102, above the substrate support 116. Mass flow controllers (not shown) for each processing gas, or alternatively, for mixtures of the processing gas, are disposed between the gas distributor 122 and the process gas source 148 to regulate the respective flow rates of the process gases into the chamber body 102.

An interior volume 114 is defined in the chamber body 102 between the substrate support 116 and the ceiling 103. A plasma is formed in the interior volume 114 from the processing gases using a coil power supply 127 which supplies power to the inductive coil 126 to generate an electromagnetic field in the interior volume 114 through an RF match network 135. The substrate support 116 may include an electrode disposed therein, which is powered by an electrode power supply 125 and generates a capacitive electric field in the processing chamber 100 through an RF match network 128. RF power is applied to the electrode in the substrate support 116 while the chamber body 102 is electrically grounded. The capacitive electric field is transverse to the plane of the substrate support 116, and influences the directionality of charged species more normal to the substrate 120 to provide more vertically oriented anisotropic etching of the substrate 120.

Process gases and etchant byproducts are exhausted from the processing chamber 100 through an exhaust system 130. The exhaust system 130 may be disposed in the chamber bottom 107 of the processing chamber 100 or may be disposed in another portion of the chamber body 102 of the processing chamber 100 for removal of processing gases. A throttle valve 132 is provided in an exhaust port 134 for controlling the pressure in the processing chamber 100.

FIG. 1 further illustrates the optical fiber bundle 104 configured to detect features within or on a substrate 120 disposed in a processing chamber 100. The optical fiber bundle 104 has a diameter of about 0.05 mm to about 2 mm. For example, the optical fiber bundle 104 has a diameter of about 1 mm. The optical fiber bundle 104 is included in a detection system 164, in one example. The detection system 164 may be an optical reflectometry system. For example, a spectroscopic reflectometry system configured to process an input channel and determine one or more characteristics of the substrate disposed in the processing chamber. For example, the detection system 164 may be an interferometer endpoint detection system configured to process an input channel and determine one or more characteristics of the substrate disposed in the processing chamber 100. In one example, which may be combined with other examples, the detection system 164 is capable of simultaneously processing a number of input channels. For instance, the detection system 164 is capable of simultaneously processing between about 1 input channel and about 20 input channels. For instance, the detection system 164 is capable of simultaneously processing between about 10 input channels and about 50 input channels. For instance, the detection system 164 is capable of simultaneously processing between about 10 input channels.

In one example, which may be combined with other examples, the detection system 164 is capable of switching between banks (not shown) of input channels to measure additional areas of substrate 120. For instance, the detection system 164 may include a number of banks, each with a number of input channels. For instance, the detection system 164 may include between about 1 bank and about 20 banks. For instance, the detection system 164 may include between at least 1 bank and about 20 banks. For instance, the detection system 164 may include 10 banks. Each bank includes a number of input channels. For instance, each bank includes between about 1 input channel and about 20 input channels. For instance, each bank includes between about 10 input channels and about 50 input channels. For instance, each bank includes between about 10 input channels.

In one example, which may be combined with other examples, the detection system 164 determines one or more characteristics, such as a dimension of a feature, height of feature, radiant emissions of the plasma, changes in plasma characteristics, or similar, of the substrate to determine the endpoint of one or more stages of an etching process. The endpoint of an etching stage may occur, for example, when a layer of the substrate 120 has been sufficiently removed, or etched through to reveal an underlying layer. In another example, the endpoint of the etching state can occur when a desired dimension, such as a desired height of a feature, has been obtained. Determination of the endpoint of the etching stage allows for etching of the substrate 120 to be halted once a stage has been completed, thus reducing the occurrence of over-etching or under-etching of the substrate 120. The endpoint of one or more of the stages may be determined by monitoring radiation emissions from plasma in the processing chamber 100, the plasma emitting radiation that changes in intensity and wavelength according to a change in the composition of the energized gas. For example, a change in composition of the energized gas can arise from the etching through of an overlying layer to expose an underlying layer on the substrate 120. As such, the detection system 164 monitors the one or more characteristics of the radiation emissions to determine the extent of etching of the substrate or other conditions in the process chamber 100.

The features of one or more stages of substrate processing of the processing chamber 100 may be determined by the detection system 164. In one example, the endpoint of a substrate processing stage may occur, for example, when a layer of the substrate 120 has been sufficiently removed, or etched through to reveal an underlying layer. In another example, the endpoint of the substrate processing stage can occur when a desired dimension, such as a desired height of a feature, or film thickness, has been obtained. Determination of the endpoint of the substrate processing stage allows for processing of the substrate 120 to be halted once a stage has been completed, thus reducing substrate defects. For example, the over, or under, etching of substrate 120. The endpoint of one or more of the substrate processing stages may be determined by monitoring radiation emissions from plasma in the processing chamber 100, the plasma emitting radiation that changes in intensity and wavelength according to a change in the composition of the energized gas. For example, a change in composition of the energized gas can arise from the etching through of an overlying layer to expose an underlying layer on the substrate 120. As such, the detection system 164 analyzes radiation emissions to determine the extent of processing of the substrate or other conditions in the processing chamber 100.

The detection system 164 further includes a light source 166, a lens assembly 168, a light detector 170, an optical splitter 172, and a controller 150. The light source 166 is configured to emit a light beam through optical splitter 172 and through the optical fiber bundle 104. The light beam impinges the substrate 120 and is reflected back through the optical fiber bundle 104. The light beam returns to the light detector 170 upon passing through the optical fiber bundle 104, and the optical splitter 172. For example, the lens assembly 168 is configured to focus the light beam into an incident light beam 176. The incident light beam 176 passes through the ceiling 103 toward the substrate support surface 188 and illuminates an area or beam spot 180 on the surface 121 of the substrate 120. In one example, which may be combined with other examples, the detection system 164 may be capable of manipulating the lens assembly 168 so that the beam spot 180 falls upon differing areas of the substrate 120 for measurement.

The incident light beam 176 is reflected by the surface 121 of the substrate 120 to form a reflected light beam 178. At least a portion of the reflected light beam 178 is directed in a direction perpendicular to the substrate support surface 188 back through the ceiling 103, through the optical fiber bundle 104 and optical splitter 172, to the light detector 170. The light detector 170 is configured to measure the intensity of the reflected light beam 178. An exemplary light detector 170 is a spectrometer.

Alternatively, the optical fiber bundle 104 can be used without the lens assembly 168, such that the optical fiber bundle 104 is coupled directly to the ceiling 103, having a single collimator disposed between the optical fiber bundle 104 and the ceiling 103. For example, focusing lens 174*b* (i.e., as the collimator) can be disposed directly between the optical fiber bundle 104 and the ceiling 103. In embodiments described herein, no collimator may be present.

The light source 166 has a monochromatic or polychromatic light source that generates the incident light beam 176 used to illuminate the beam spot 180 on the substrate 120. The intensity of the incident light beam 176 is selected to be sufficiently high enough to enable the reflected light beam 178 to have a measurable intensity. In one example, the light source 166, such as a xenon (Xe) lamp, provides a polychromatic light and generates an emission spectrum of light in wavelengths from about 200 nm to about 800 nm. The light source 166 can include a polychromatic source. The polychromatic light may be filtered to select the frequencies comprising the incident light beam 176. Color filters can be placed in front of the light detector 170 to filter out all wavelengths except for the desired wavelength(s) of light, prior to measuring the intensity of the reflected light beam 178 entering the light detector 170. The light source 166 can also include a monochromatic source, for example a helium-neon (He—Ne) laser, or neodymium-doped yttrium-aluminum-garnet (Nd-YAG) laser, LED, or other monochromatic light source, provides a selected wavelength of light.

One or more mirrors 186, and one or more focusing lenses, such as focusing lens 174*a*, and focusing lens 174*b* to may be used to focus the incident light beam 176 from the light source 166 to form the beam spot 180 on the surface 121 of the substrate 120. The one or more mirrors 186, and one or more focusing lenses, such as focusing lens 174*a*, and focusing lens 174*b* to may be used to focus the reflected light beam 178 back on an active surface of the light detector 170.

In one example, which may be combined with other examples, the one or more mirrors may be fixed mirrors, adjustable mirrors, or digital-mirror-devices (DMD). The size or area of the beam spot 180 should be sufficiently large to compensate for variations in surface topography of the substrate 120 and device design features. The size of the beam spot 180 enables detection of features and characteristics of the substrate 120. For example, feature pitch and depth, film thickness, and other physical characteristics. The area of the reflected light beam is sufficiently large to activate a large portion of the active light-detecting surface of the light detector 170.

The incident light beam 176, and the reflected light beam 178, are directed through a transparent window 182 of the processing chamber 100. The transparent window 182 allows the incident light beam 176, and the reflected light beam 178, to pass in and out of the processing environment of the processing chamber 100. The substrate support surface 188 of the substrate support 116 on which the substrate 120 rests is disposed parallel to the ceiling 103. In one example, the transparent window 182 is located in the ceiling 103 of the processing chamber 100, oriented relative to the substrate 120 and the substrate support 116. The transparent window 182 is configured to receive an incident light beam from the detection system 164. The transparent window 182 enables transmission of the incident light beam 176 to the substrate. The transparent window 182 also enables the reflected light beam 178 to pass therethrough upon reflection from the substrate 120. The transparent window 182 is further configured to transmit the reflected light beam 178 to the detection system 164.

The controller 150 is electrically coupled to the detection system 164, including light detector 170, controller 150, and the light source 166 via a wire 158. The controller 150 calculates portions of the real-time measured waveform spectra of reflected light beam 178 reflected from the beam spot 180 on substrate 120 and processes the spectra by using advanced spectral analysis techniques, including comparing the spectra with stored characteristic waveform patterns. In one example, which may be combined with other examples, the controller 150 calculates and adjusts the position and orientation of the lens assembly 168.

The controller 150 includes a programmable central processing unit (CPU) 152 which is operable with a memory 154 (e.g., non-volatile memory) and support circuits 156. The support circuits 156 are conventionally coupled to the CPU 152 and comprise cache, clock circuits, input/output subsystems, power supplies, and the like, and combinations thereof coupled to the various components of the processing chamber 100, to facilitate control thereof.

The CPU 152 is one of any form of general purpose computer processor used in an industrial setting, such as a programmable logic controller (PLC), for controlling various components and sub-processors of the processing system. The memory 154, coupled to the CPU 152, is non-transitory and is typically one or more of readily available memories such as random access memory (RAM), read only memory (ROM), floppy disk drive, hard disk, or any other form of digital storage, local or remote.

Typically, the memory 154 is in the form of a non-transitory computer-readable storage media containing instructions (e.g., non-volatile memory), which when executed by the CPU 152, facilitates the operation of the processing chamber 100. The instructions in the memory 154 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more controllers 150 may be used with one or any combination of the various systems described herein.

Figure 2:
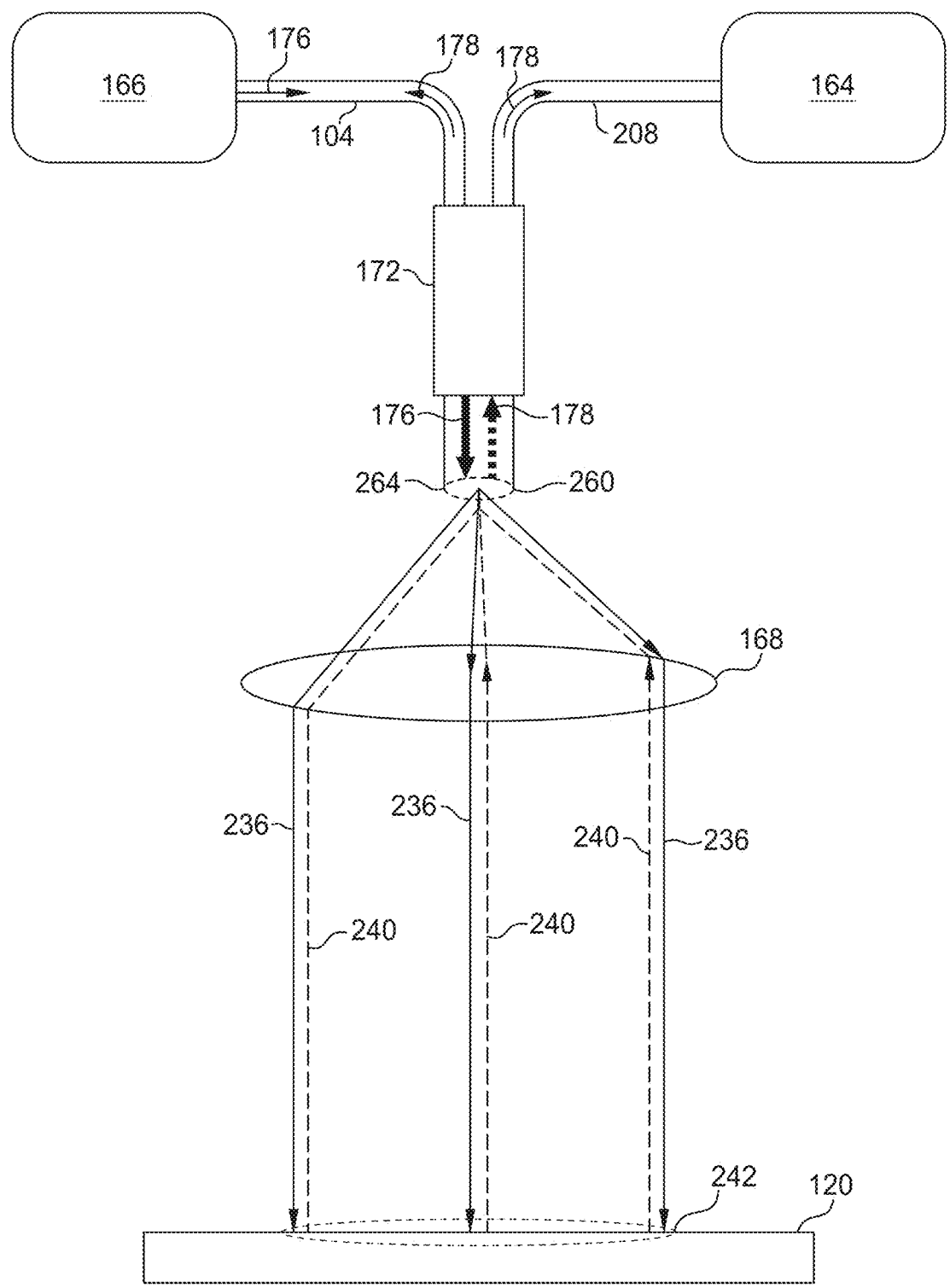
FIG. 2 is an example schematic cross sectional view of a collimated optical path with an optical fiber bundle configured to transmit and receive light in a processing chamber, as commonly employed in the prior art

FIG. 2 is an example schematic cross sectional view of a collimated optical path with an optical fiber configured to transmit and receive light in a processing chamber, as commonly employed in the prior art.

An incident light beam 176, originating at the light source 166, is collected by the optical fiber bundle 104. The incident light beam is received by an optical splitter 172. In some examples, the optical splitter 172 is disposed along the length of the optical fiber bundle 104. In other examples, the optical splitter 172 may be disposed at the light source 166. The incident light beam 176 originating from the light source 166, passes through the optical splitter 172 and exits the optical fiber bundle 104 at the fiber bundle exit 264. The fiber bundle exit 264 is positioned above the lens assembly 168, which includes a lens acting as a collimator. The incident light beam 176 has an initial spot size approximately equal to the optical fiber diameter. For example, the initial spot size 260 may be around 100 micrometers (µm) in diameter. The incident light beam 176 exits the fiber bundle exit 264 in a spread out pattern as rays of incident light 236 each interacting with a different portion of the lens assembly 168. The rays of incident light 236 next pass through the lens assembly 168 where the rays of incident light 236 are collimated and transmitted toward the substrate 120. After impinging the substrate 120, the rays of incident light 236, are reflected back toward the optical fiber bundle 104 as rays of reflected light 240.

Due to the space constraints, the distance from fiber bundle exit 264 to the lens assembly 168 is usually smaller than the distance between lens assembly 168 and substrate 120 surface. This results in an amplification of the substrate image size 242 on the substrate 120 surface compared to the size of the initial spot size 260. For example, the substrate image size 242 may be 10 millimeters (mm) in diameter. For example, the substrate image size 242 may be 100 mm in diameter. The area of the substrate image size 242 being the area to be measured by detection system 164.

After passing through the lens assembly, the rays of reflected light 240 are returned to the optical fiber bundle 104. Collectively, the rays of reflected light 240 make up the reflected light beam 178. The rays of reflected light 240 are then returned to the optical splitter 172. A first portion of the reflected light beam 178 received at the optical splitter 172, for example about 50%, is then transmitted, via the return fiber bundle 208, to the detection system 164.

Figure 3:
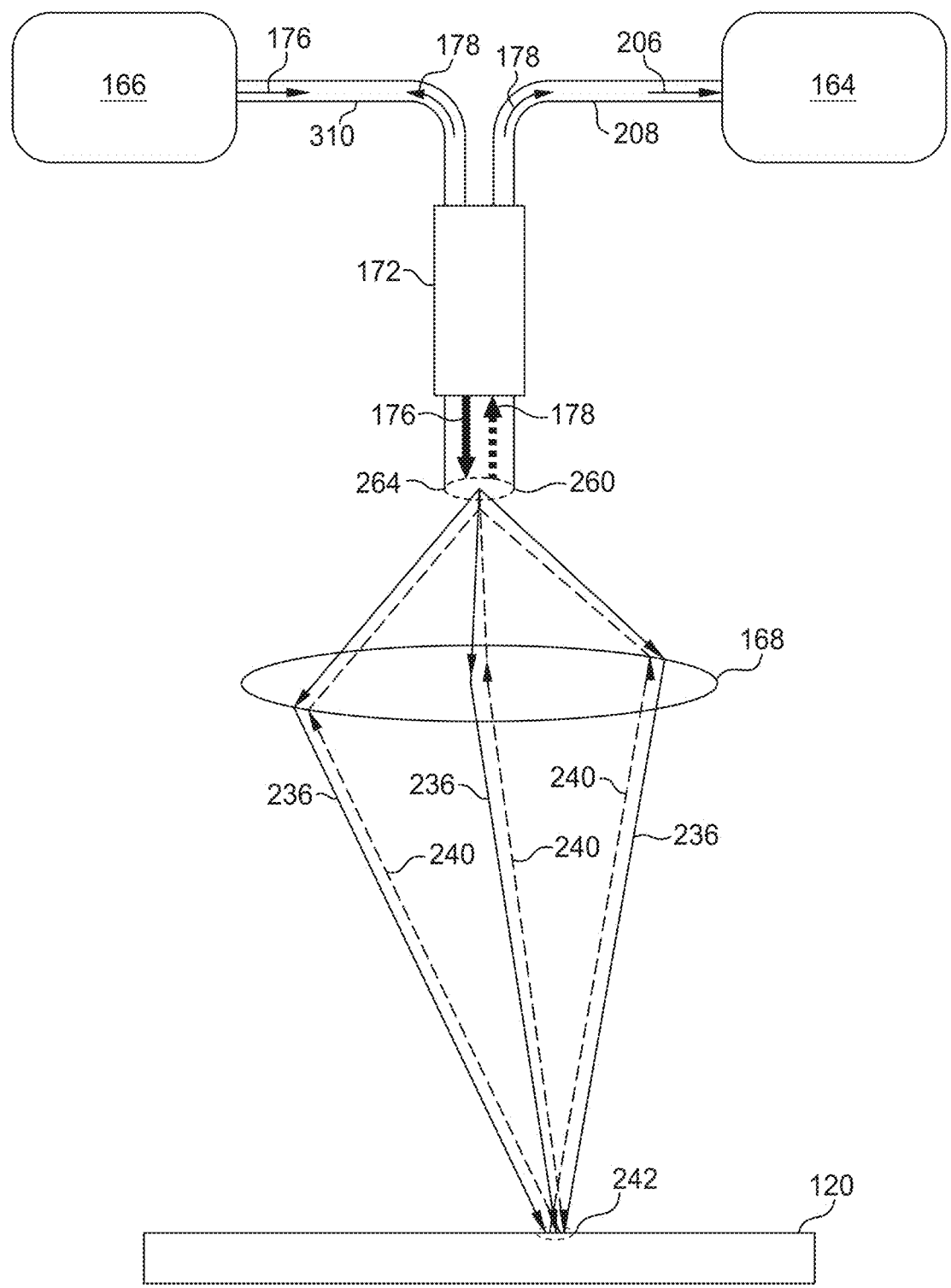
FIG. 3 is an example schematic cross sectional view of an optical path of a single optical fiber configured to transmit and receive light in the processing chamber, in accordance with one example of the disclosure.

FIG. 3 is an example schematic cross sectional view of an optical path of a single optical fiber configured to transmit and receive light in the processing chamber 100 showing an improved spatial resolution on the substrate.

The incident light beam 176, emitted by the light source 166, is received by the optical fiber bundle 104. The optical fiber bundle 104 includes a plurality of fibers. Each fiber of the plurality of fibers of the optical fiber bundle 104 has a diameter between about 0.01 mm and 1 mm. For example, each fiber of the plurality of fibers of the optical fiber bundle 104 diameter is about 0.5 mm. The optical fiber bundle 104 transmits the incident light beam 176 and is received by an optical splitter 172. In some embodiments, the optical splitter 172 is disposed along the length of the optical fiber bundle 104. In other embodiments, the optical splitter 172 may be disposed at the light source 166. In other embodiments, the optical splitter 172 may be disposed at the end of the optical fiber bundle 104.

A first portion, for example about 50%, of the received incident light beam 176 is transmitted by the optical splitter 172, as a reference light beam 206, through a return fiber bundle 208, the detection system 164. The reference light beam 206 is received by the detection system 164, and used as a reference to reduce noise, and improve signal to noise ratio (SNR). A second portion, for example about 50%, of the received incident light beam 176 is transmitted by the optical splitter 172 and exits the optical fiber bundle 104 at the fiber bundle exit 264.

The fiber bundle exit 264 is positioned above the lens assembly 168, shown with a fiber-to-lens distance 252. The incident light beam 176 has an initial spot size approximately equal the diameter of a fiber of the plurality of fibers of the optical fiber bundle 104. For example, the initial spot size 260 has a diameter between about 0.01 mm and 1 mm. For example, the initial spot size 260 diameter is about 0.5 mm. The fiber-to-lens distance 252 is about 40 millimeters (mm) to about 80 mm. For example, the fiber-to-lens distance 252 is about 50 mm.

The focusing lens assembly 168 has a lens-to-substrate distance 254 from the substrate 120. The lens-to-substrate distance 254 is based upon a ratio of the fiber-to-lens distance 252. For example, the lens-to-substrate distance 254 ratio is between about 1:1 to about 10:1. For example, the lens-to-substrate distance 254 ratio is about 4:1. In another example, the lens-to-substrate distance 254 ratio is about 5:1.

The incident light beam 176 exits the fiber bundle exit 264 in a spread out pattern as rays of incident light 236 each interacting with a different portion of the lens assembly 168. The rays of incident light 236 next pass through the lens assembly 168 where the rays of incident light 236 are focused, but not collimated, and transmitted toward the substrate 120.

After impinging the substrate 120, the rays of incident light 236, are reflected back toward the optical fiber bundle 104 as rays of reflected light 240. Due to the space constraints, the distance from fiber bundle exit 264 to the lens assembly 168 is usually smaller than the distance between lens assembly 168 and substrate 120 surface. This results in an amplification of the substrate image size 242 on the substrate 120 surface. For example, the substrate image size 242 may be larger than the initial spot size 260 by about the ratio of lens-to-substrate distance 254 to the fiber-to-lens distance 252. For example, the substrate image size 242 has a diameter between about 0.01 mm and 10 mm. For example, the substrate image size 242 is about 0.4 millimeters (mm) in diameter. For example, the substrate image size 242 is about 0.1 mm in diameter. For example, the substrate image size 242 is about 4 mm in diameter. As compared FIG. 2, the optical path described herein offers a reduction in substrate image size 242. Reducing the substrate image size 242 results in the reflected signal/spectra containing less information about non-targeted areas of the substrate, thereby increasing system sensitivity and detail resolution.

The rays of reflected light 240 are returned to the lens assembly 168. After passing through the lens assembly 168, the rays of reflected light 240 are transmitted to the optical fiber bundle 104. Collectively, the rays of reflected light 240 make up the reflected light beam 178. In one example, the optical fiber bundle 104 can be concentric with the lens assembly 168. The received rays of reflected light 240 are then transmitted to the optical splitter 172. A first portion of the reflected light beam 178 received at the optical splitter 172, for example about 50%, is then transmitted, via the return fiber bundle 208, to the to the detection system 164. A second portion of the reflected light beam 178 received at the optical splitter 172, for example about 50%, is transmitted to the light source 166, via the optical fiber bundle 104.

Figure 4:
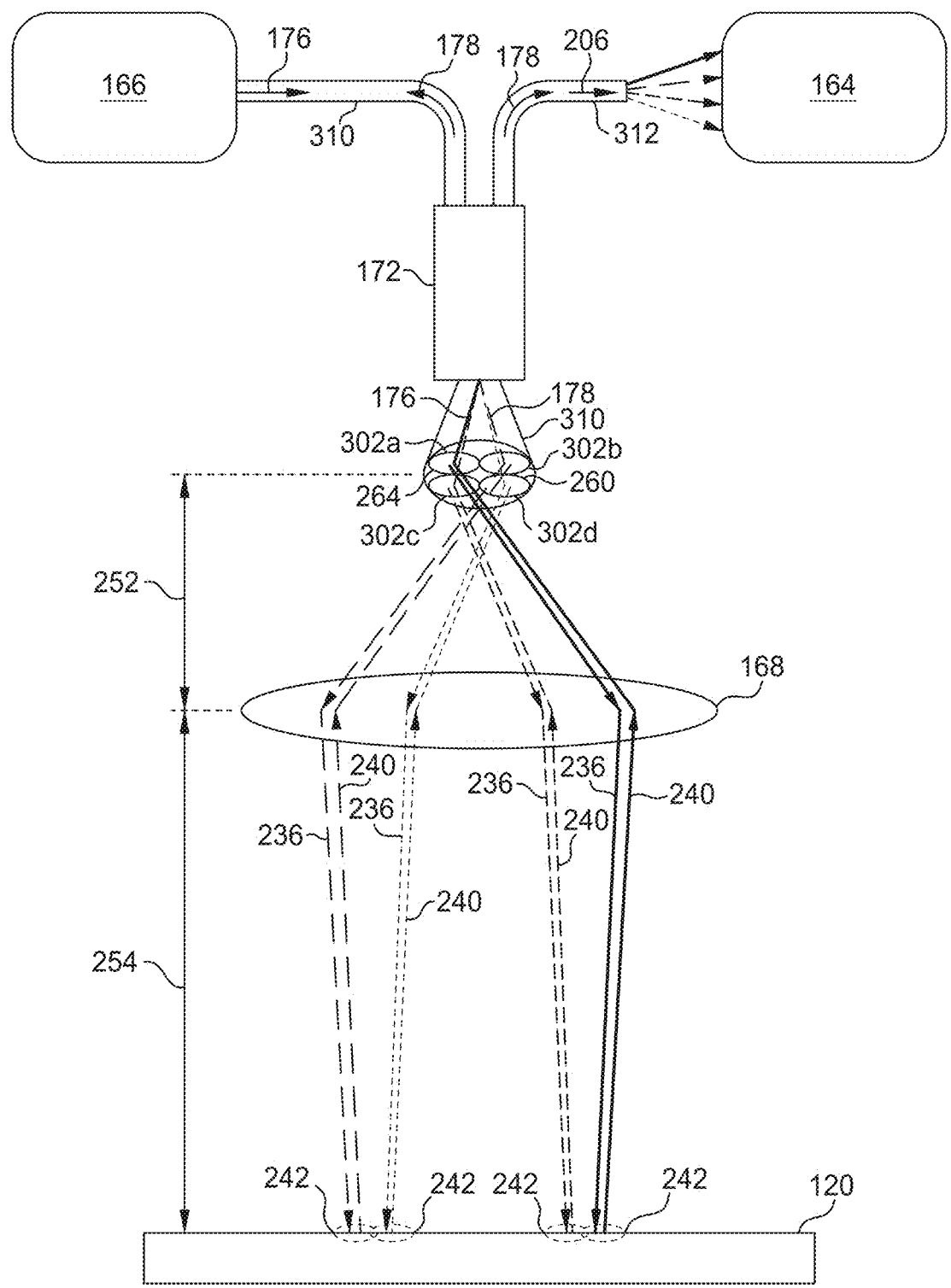
FIG. 4 is a schematic cross sectional view of a fiber bundle design and optical path with an optical fiber bundle configured to transmit and receive light in a processing chamber, in accordance with one example of the disclosure.

FIG. 4 is a schematic cross sectional view of a fiber bundle design and optical path with an optical fiber bundle 310 configured to transmit and receive light in a processing chamber 100 illustrating a multi-spot hyper-spectral system.

Incident light beam 176, originating at the light source 166, is collected by the optical fiber bundle 310. The optical fiber bundle 310 has a diameter of about 0.05 mm to about 2 mm. For example, the optical fiber bundle has a diameter of about 1 mm. The optical fiber bundle includes a plurality of optical fibers 302. For example, an optical fiber 302a, an optical fiber 302b, an optical fiber 302c, and an optical fiber 302d. Each fiber of the plurality of optical fibers 302 has a diameter between about 0.01 mm and 1 mm. For example, the optical fibers 302 have a diameter about 0.5 mm. Each of the plurality of optical fibers 302 includes a fiber bundle exit 264.

The incident light beam 176 is transmitted by the plurality of optical fibers 302 to an optical splitter 172. In some examples, the optical splitter 172 is disposed along the length of the optical fiber bundle 104. In other examples, the optical splitter 172 may be disposed at the light source 166. In one example, about 50% of the received incident light beam 176 exits through the optical splitter 172 and passes, a reference light beam 206, through a return fiber bundle 312 comprising a plurality of return fibers 302, to the detection system 164. In other examples, a lower, or higher, percentage of the received incident light beam 176 exits through the optical splitter 172 and passes, as a reference light beam 206 through a return fiber bundle 312, the detection system 164.

In one example, which may be combined with other examples, the optical splitter 172 splits the reference light beam 206 from the incident light beam 176 optically. In another example, which may be combined with other examples, the optical splitter 172 splits the reference light beam 206 from the incident light beam 176 by redirecting a portion of the plurality of fibers 302 from the optical fiber bundle 310 to the return fiber bundle 312. In one example, which may be combined with other examples, the reference light beam 206 may be attenuated prior to being received by the detection system 164. In one example, which may be combined with other examples, the reference light beam 206 may be attenuated by the detection system 164. As shown, and explained below in FIG. 5A, the reference light beam 206 is employed the detection system 164 to reduce noise and improve the signal-to-noise ratio (SNR).

In another example, which may be combined with other examples, optical splitter 172 may allow a first portion of the plurality of return fibers to each receive a sub-portion of reference light beam corresponding to an area of the light source 166, and allow a second portion plurality of return fibers to each receive a sub-portion the reflected light beam originally corresponding to the same area of the light source. As shown, and explained below in FIG. 5B, this allows for additional SNR improvements, or allowing SNR improvements for measurements of each area of a substrate, by the detection system 164

The remainder of the received incident light beam 176, about 50% of the light originating from the light source 166, passes through the optical splitter 172 and exits the optical fiber bundle 310 from the plurality of optical fibers 302 as rays of incident light 236. For example, as rays of incident light 236 from optical fiber 302a, as rays of incident light 236 from optical fiber 302b, as rays of incident light 236 from optical fiber 302c, and as rays of incident light 236 from optical fiber 302d, all directed toward focusing lens 174b. In other examples, a lesser or greater percentage of the light originating from the light source 166, passes through the optical splitter 172 and exits the optical fiber bundle 310 from the plurality of optical fibers 302 as rays of incident light 236.

The fiber bundle exit 264 of the optical fiber bundle 310 is positioned further than the focal point of the focusing lens 174b, illustrated as a fiber-to-lens distance 252. The fiber-to-lens distance 252 is about 40 millimeters (mm) to about 80 mm. For example, the fiber-to-lens distance 252 is about 50 mm. The focusing lens 174b additionally has a lens-to-substrate distance 254 from the substrate 120. The rays of incident light 236 pass through the focusing lens 174b. The rays of incident light 236 exit the focusing lens 174b, and contact the substrate 120 in, or about, the substrate image size 242. The area of the substrate image size 242 formed by the rays of incident light 236 is larger than the exit of the optical fiber bundle 310. The larger area of substrate image size 242 is generally due to space constraints. For example, the fiber-to-lens distance 252, is typically smaller than the lens-to-substrate distance 254 resulting in an increase of the area of substrate image size 242 on the substrate.

After impinging the substrate 120, the beam reflected light 178, as rays of reflected light 240, is reflected back toward the optical fiber bundle 310. The rays of reflected light 240 reflected by the substrate 120 are returned to the focusing lens 174b. After passing through the focusing lens 174b, the rays of reflected light 240 are returned to the same fiber of plurality of optical fibers 302 that the rays of incident light 236 originated from. For example, to optical fiber 302a, optical fiber 302b, optical fiber 302c, and optical fiber 302d. In other examples, which may be combined with other examples, the rays of reflected light 240 return to a different fiber of the plurality of optical fibers 302 than the fiber of the plurality of optical fibers the rays of incident light 236 originated from.

The rays of reflected light 240 are then returned to the optical splitter 172. About 50% of the reflected light beam 178 received at the optical splitter 172 is then transmitted, via the return fiber bundle 312, to the light detector 170 of the detection system 164. About 50% of the reflected light beam 178 received at the optical splitter 172 is then transmitted to the light source 166, via the optical fiber bundle 310.

In one example, which may be combined with other examples, the detection system 164 is capable of measuring the multi-wavelength (wideband spectra) of the reflected light beam 178 collected by each fiber of the plurality of fibers 302.

In other examples, which may be combined with other examples, the reflected light beam 178 may be filtered, or unfiltered, attenuated, or unattenuated, and a photodiode, or charge-coupled device (CCD) employed within the detection system 164 is used measure the total power for each fiber of the plurality of fibers 302.

In other examples, which may be combined with other examples, the detection system 164, is capable of measuring the multi-wavelength (wideband spectra) of the reflected light beam 178 collected by each fiber of the plurality of fibers 302 simultaneously. Each fiber, of the plurality of fibers 302, transmits rays of reflected light 240 collected from different locations of the substrate to different portions of the detection system 164, the detection system 164 is capable of simultaneous multi-location multi-spectral measurements.

Figure 4A:
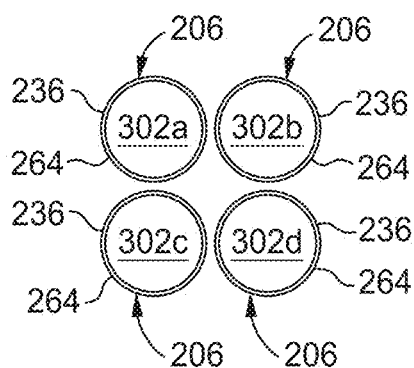
FIG. 4A is a cross-sectional view of the exit of an optical fiber bundle configured to transmit and receive light in a processing chamber, in accordance with one example of the disclosure.

FIG. 4A is a cross-sectional view of the exit of an optical fiber bundle 310 configured to transmit and receive light in a processing chamber 100, in accordance with one example of the disclosure. More specifically, FIG. 4A illustrates the incident light beam 176, as rays of incident light 236, having been 236 transmitted by the plurality of optical fibers 302. The rays of incident light 236 emitting from each fiber bundle exit 264 has an initial spot size 260 approximately equal to the optical fiber bundle 104 diameter. The initial spot size 260 of the plurality of fibers 302 is a reduction from the initial spot size 260 shown in FIG. 2.

Figure 4B:
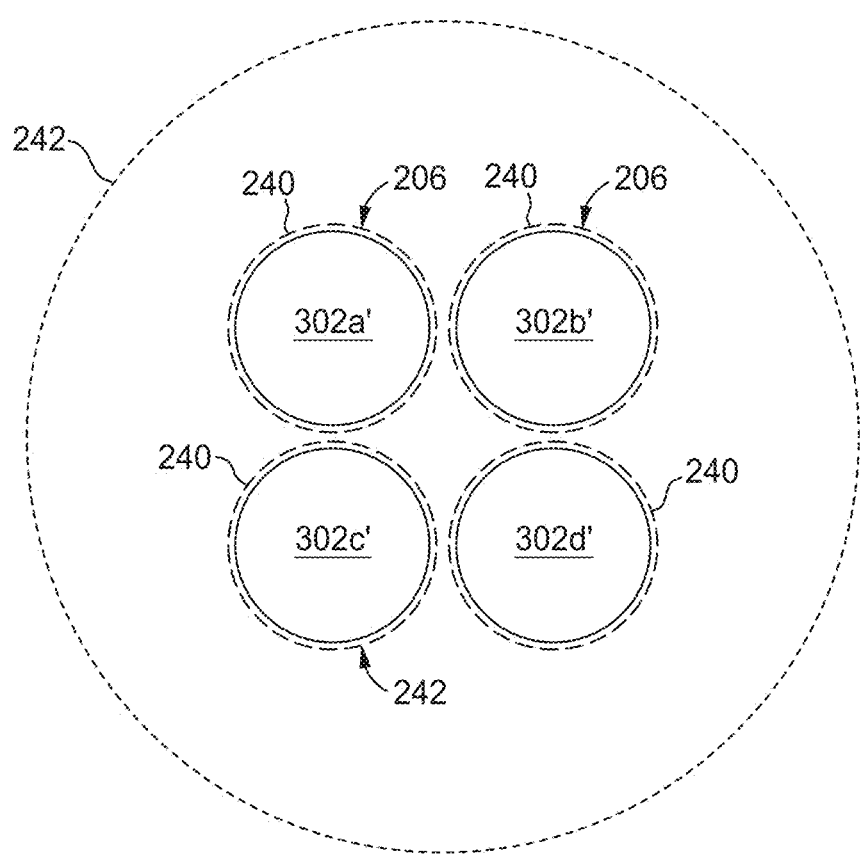
FIG. 4B is an example cross-sectional view of the light beams transmitted from a plurality of optical fibers, as received, and reflected at the surface of substrate, in accordance with one example of the disclosure.

FIG. 4B is an example cross-sectional view of the light beams transmitted from the plurality of optical fibers 302, as received, and reflected at the surface of substrate 120, in accordance with one example of the disclosure. More specifically, FIG. 4B is a cross-sectional view of rays of incident light 236 received from the plurality of optical fibers 302, optical fiber 302a, optical fiber 302b, optical fiber 302c, and optical fiber 302d, and reflected as rays of reflected light 240, from a plurality of reflection areas 302', a reflection area 302a', a reflection area 302a', a reflection area 302a', and a reflection area 302a', falling within, or about, the area of substrate image size 242 on substrate 120 shown in FIG. 4. The rays of reflected light 240 emanating from the reflection areas 302' have a substrate image size 242. The substrate image size 242 is larger than the initial spot size 260. For example, the substrate image size 242 has a diameter between about 0.1 mm and 10 mm. The substrate image size 242 is about 0.05 mm to 4 mm. For example, the substrate image size 242 is about 1 mm. The substrate image size 242 shown in FIG. 4B is a reduction from the substrate image size 242 shown in FIG. 2B. Each reflection area of the plurality of reflection areas 302' returns a polychromatic reflected spectra of a different area of the substrate, simultaneously, for analysis and measurement by the detection system 164.

The optical fiber bundle 310 disclosed herein, by having a plurality of optical fibers 302, enables an increase in the number of reflection areas 302'. Each of the reflection areas 302' includes a reduced substrate image size 242 is a reduction from the substrate image size 242 of the example of FIG. 2. In one example, which may be combined with other examples, reducing the input fiber diameter allows having a reduced substrate image size 242 allows about a ten-times, or more, improvement in spatial resolution when compared to current reflectometry devices and methods.

In another example, which may be combined with other examples, the optical fiber bundle 310 disclosed herein, by having a plurality of optical fibers 302, improves reflectometer sensitivity by permitting the entire spectra for each fiber measuring a smaller and separate area of the substrate. In another example, which may be combined with other examples, the increase in the number of reflection areas 302', each having a reduced substrate image size 242, may allow for more areas of a substrate to be analyzed separately at the same time, and with increased sensitivity, when compared to current reflectometry devices and methods. In another example, which may be combined with other examples, the increase in the number of reflection areas 302' having a reduced substrate image size 242 may allow for differential measurement improving detection sensitivity. For example, the reflection area 302a' may fall upon a portion of the substrate without features, with less features, or more features, than reflection area 302d' allowing for differential measurement between the two areas of the substrate. In another example, which may be combined with other examples, the increase in the number of reflection areas 302' having a reduced substrate image size 242 may allow for each portion of the reflected light beam 178 collected by the plurality of optical fibers 302 to each go into a different portion of the detection system 164 for analysis.

Figure 5A:
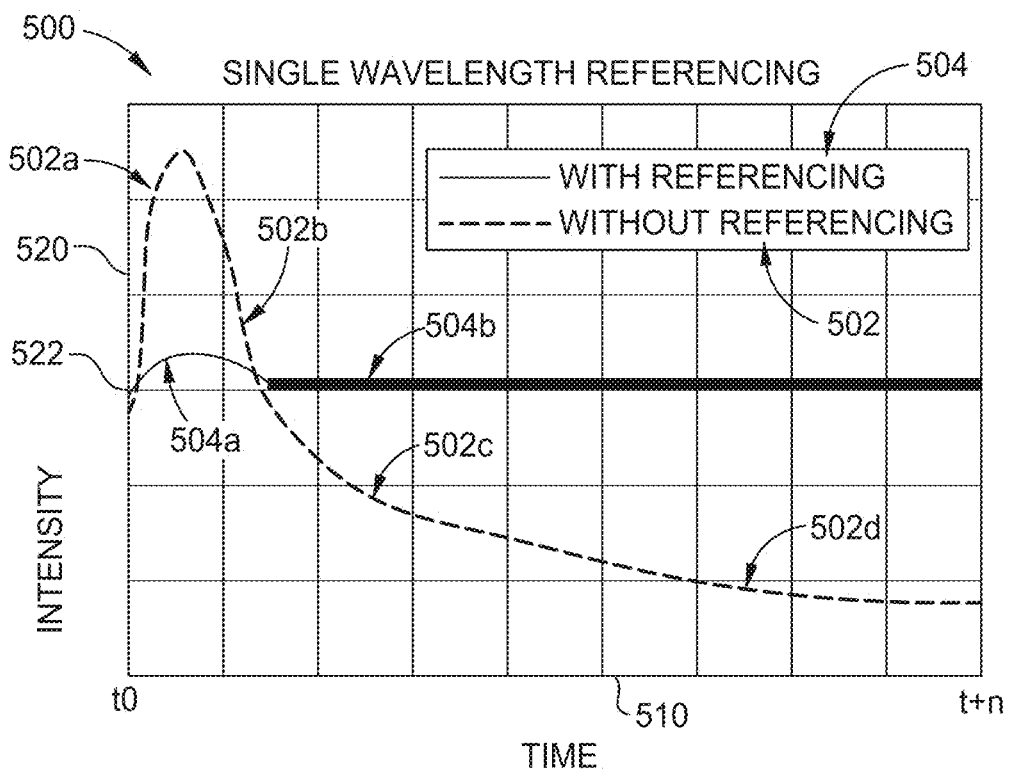
FIG. 5A illustrates a graph of single wavelength referencing, in accordance with one example of the disclosure.

FIG. 5A shows a graph 500, titled "Single Wavelength Referencing" illustrates the drift in intensity of an example light source, for example light source 166, over time, and how a detection system, such as detection system 164, compensates for intensity drift by referencing improving signal stability and SNR.

Graph 500 includes two axes. A horizontal axis 510, labeled "TIME", illustrates an increases in time from the left side of the graph, t0, to the right side of the graph, t+n. A vertical axis 520, labeled "INTENSITY", illustrates an intensity value showing increase in intensity above about point 522, and a decrease in intensity below about point 522.

Graph 500 includes two plotted trend lines, a first trend line 502, and a second trend line 504. The first trend line 502 illustrates the drift in intensity of an example light source, for example light source 166, over time. Looking at the first trend line 502, it is illustrated that initially, the intensity of the light source first begins a sharp increase in intensity 502a, followed by sharp decrease in intensity 502b. Shortly after, the intensity decrease begins to taper, 502c, and arrive at semi-continuous intensity 502d.

This change in intensity over time presents a problem for a detection system. Without referencing, such as illustrated by the first trend line 502, a measurement taken at a point in time, could not be reliably compared to a measurement taken at a later point in time as the change intensity innately changes the measured value.

The second trend line 504 illustrates the drift in intensity of an example light source, for example light source 166, over time with referencing by the detection system 164. Using referencing, the sharp increase and decrease of the first trend line 502 is instead a damped rise 504a followed by a constant intensity value 504b. Using referencing, the intensity of the light source is normalized, and the SNR is improved.

Figure 5B:
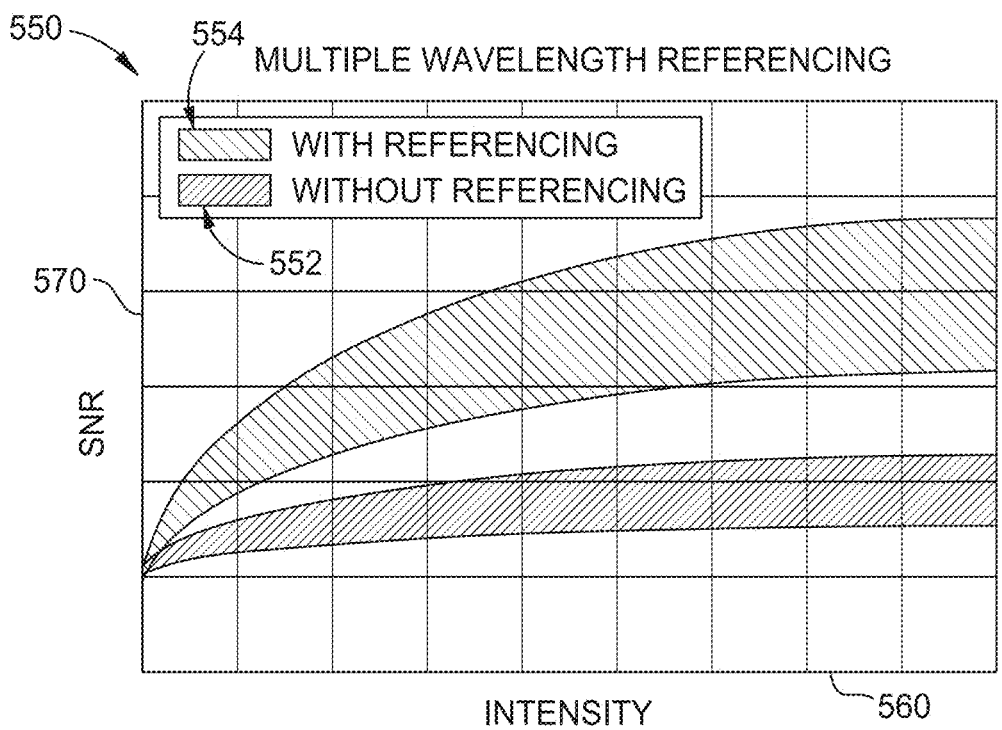
FIG. 5B illustrates a graph of multiple wavelength referencing, in accordance with one example of the disclosure.

FIG. 5B shows a graph 550, titled "Multiple Wavelength Referencing" illustrates the improvement in SNR gained by referencing in the detection system 164 over multiple wavelengths of light. Graph 550 includes two axes. A horizontal axis 510, labeled "INTENSITY", illustrates a variety of light source intensities at different wavelengths from the left side of the graph 550 to the right side of graph 550. A vertical axis 520, labeled "SNR", plots the improvement in signal-to-noise.

Graph 550 includes two plotted areas, a first area 552 without referencing, and a second area 554 with referencing. The first area 552 illustrates that without referencing, as lamp intensity increases, there is a small improvement in SNR across multiple wavelengths of light. The second area 554 illustrates, that with referencing, the detection system 164 as described herein can improve the SNR over the multiple wavelengths of light.

Figure 6:
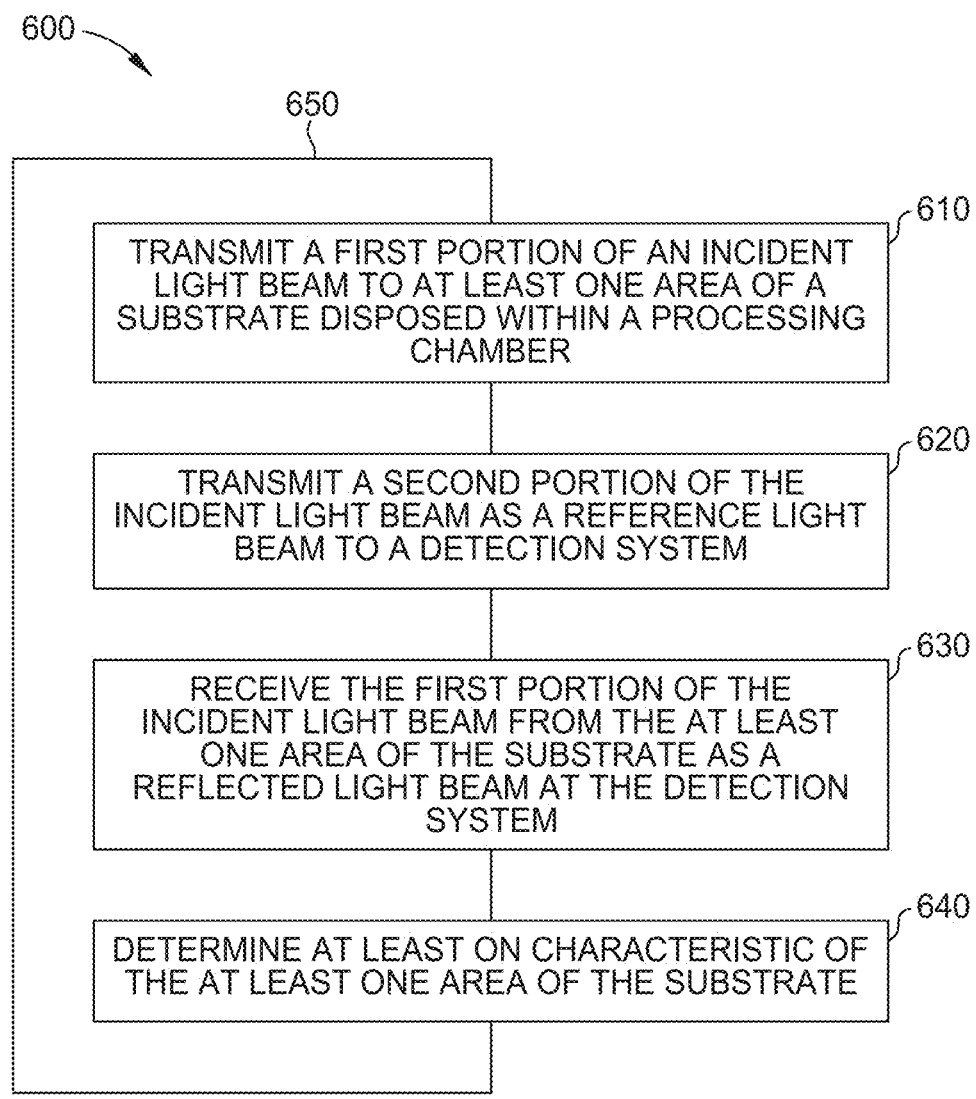
FIG. 6 is a flow diagram of a method for emitting and collecting reflected light within a processing chamber, in accordance with one example of the disclosure.

FIG. 6 is a flow diagram of a method 600 for emitting and collecting reflected light within a processing chamber, in accordance with one example of the disclosure. Method 600 may be understood with reference to FIGS. 4, and 4A-4B. FIG. 6 includes a simplified version of the claimed subject matter and is not intended to constrain the present disclosure.

Operation 610 of method 600 includes transmitting a first portion of an incident light beam to at least one area of a substrate 120 disposed within a processing chamber 100.

Operation 610 of method 600 may include transmitting, via an optical fiber bundle 310 comprising at least a first optical fiber, an incident light beam 176 from a light source 166 to an optical splitter 172. Operation 610 of method 600 may include transmitting at least a sub-portion of the incident light beam 176 from at least a first sub-area of the light source 166 to the at least a first optical fiber, receiving the at least a sub-portion of the incident light beam 176 at the optical splitter 172 from the at least a first optical fiber.

Operation 610 of method 600 may include transmitting a first portion of the incident light beam 176, via the optical fiber bundle 310, from the optical splitter 172 to a lens assembly 168. Operation 610 of method 600 may include dividing at least a sub-portion of the incident light beam 176 into at least a first sub-portion of incident light, wherein the at least a first sub-portion of incident light corresponds to the at least a first sub-area of the light source 166, and returning the at least a first sub-portion of incident light from the optical splitter 172 to the at least a first optical fiber, and transmitting the at least a first sub-portion of incident light from the at least a first optical fiber to the lens assembly 168.

Operation 610 of method 600 may include focusing the first portion of the incident light beam 176 as rays of incident light from the lens assembly 168 upon at least one area of a substrate 120 disposed within a processing chamber 100. Operation 610 of method 600 may include receiving, via the optical fiber bundle 310, at least a first sub-portion of the incident light beam 176 from the optical splitter 172, and focusing the at least a first sub-portion of the incident light beam 176 as rays of incident light 236 from the lens assembly 168 to at least at least one area of the substrate 120.

Operation 620 of method 600 includes transmitting a second portion of the incident light beam 176 as a reference light beam 206 to a detection system 164.

Operation 620 of method 600 may include transmitting a second portion of the incident light beam 176 as a reference light beam 206, via a return fiber bundle 312 comprising at least one return fiber, from the optical splitter 172 to a detection system 164.

Operation 620 of method 600 may include dividing at least a sub-portion of the incident light beam 176 into at least a second sub-portion of incident light wherein the at least a second sub-portion of incident light corresponds to the at least a first sub-area of the light source 166, transmitting the at least a second sub-portion of incident light from the optical splitter 172 to the at least a first return fiber as at least a first sub-portion of a reference light beam 206 to the detection system 164, and receiving the at least a first sub-portion of a reference light beam 206 from the at least a first return fiber at the detection system 164, wherein the at least a first sub-portion of a reference light beam 206 corresponds to the at least a first sub-area of the light source 166.

Operation 630 of method 600 includes receiving the first portion of the incident light beam 176 from the at least one area of the substrate 120 as a reflected light beam 178 at the detection system 164.

Operation 630 of method 600 may include receiving rays of reflected light 240 from the at least one area of the substrate 120 at the lens assembly 168, transmitting the rays of reflected light 240, as at least a first sub-portion of a reflected light beam 178, from the lens assembly 168 to at least a first optical fiber of the optical fiber bundle 310, transmitting the rays of reflected light 240 as a reflected light beam 178 from the lens assembly 168, via the optical fiber bundle 310, to the optical splitter 172, and transmitting the reflected light beam 178 from the optical splitter 172, via the return fiber bundle 312, to the detection system 164.

Operation 630 of method 600 may include receiving, from at least one area of the substrate 120, rays of reflected light 240 at the lens assembly 168, and transmitting the rays of reflected light 240, as at least a first sub-portion of a reflected light beam 178, from the lens assembly 168 to at least a first optical fiber.

Operation 640 of method 600 includes determining at least on characteristic of the area of the substrate 120.

Operation 640 of method 600 may include receiving at least a first sub-portion of a reference light beam 206, wherein the at least a first sub-portion of a reference light beam 206 corresponds to the at least a first sub-area of the light source 166, receiving at least a first sub-portion of a reflected light beam 178, wherein at least the first sub-portion of the reflected light beam 178, corresponds to at least a first sub-portion of incident light, wherein the at least a first sub-portion of incident light corresponds to the at least the first sub-area of the light source 166, and referencing the first sub-portion of the reference light beam 206 to the first sub-portion of a reflected light beam 178 to improve a first signal-to-noise ratio (SNR).

Operation 640 of method 600 may include analyzing a full spectrum of the reflected light beam 178 based, in part, on the first SNR, wherein the full spectrum is between about 200 nanometers (nm) to about 800 nm.

Operation 640 of method 600 may include determining, based upon the first SNR, and analyzing full spectrum of the reflected light beam 178: at least one height of a feature disposed on the at least one area substrate 120, at least one dimension of a feature disposed on the at least one area substrate 120, at least one wavelength of a radiant emission of a plasma from the at least one area of the substrate 120, at least one intensity of the radiant emission of the plasma from the at least one area of the substrate 120, or a combination thereof.

Operation 640 of method 600 may include receiving at least a first sub-portion of a reference light beam 206, wherein the at least a first sub-portion of a reference light beam 206 corresponds to at least a first sub-area of the light source 166, receiving at least a second sub-portion of a reference light beam 206, wherein the at least a second sub-portion of a reference light beam 206 corresponds to at least a second sub-area of the light source 166, receiving at least a first sub-portion of a reflected light beam 178 from at least a first area of the substrate 120, wherein at least the first sub-portion of the reflected light beam 178, corresponds to at least a first sub-portion of incident light, wherein the at least a first sub-portion of incident light corresponds to the at least the first sub-area of the light source 166, receiving at least a second sub-portion of a reflected light beam 178 from at least a second area of the substrate 120, wherein at least the second sub-portion of the reflected light beam 178, corresponds to at least a second sub-portion of incident light, wherein the at least a second sub-portion of incident light corresponds to the at least the second sub-area of the light source 166, referencing the first sub-portion of the reference light beam 206 to the first sub-portion of a reflected light beam 178 to improve a first SNR, and referencing the second sub-portion of the reference light beam 206 to the second sub-portion of a reflected light beam 178 to improve a second SNR.

Operation 640 of method 600 may include analyzing a full spectrum of at least the first sub-portion of a reflected light beam 178 based, in part, on the first SNR, wherein the full spectrum is between about 200 nanometers (nm) to about 800 nm, and analyzing a full spectrum of at least the second sub-portion of a reflected light beam 178 based, in part, on the second SNR, wherein the full spectrum is between about 200 nanometers (nm) to about 800 nm.

Operation 640 of method 600 may include determining at least one characteristic at least a first area of the substrate 120 based upon the improved first SNR, and analyzing a full spectrum of at least the first sub-portion of a reflected light beam 178, wherein determining the at least one characteristic further comprises determining: at least one height of a feature disposed on at least the first area of the substrate 120, at least one dimension of a feature disposed on at least the first area of the substrate 120, at least one wavelength of a radiant emission of a plasma from at least the first area of the substrate 120, at least one intensity of the radiant emission of the plasma from at least the first area of the substrate 120, or a combination thereof, determining at least one characteristic at least a second area of the substrate 120 based upon the improved first SNR, and analyzing a full spectrum of at least the second sub-portion of a reflected light beam 178, wherein determining the at least one characteristic further comprises determining: at least one height of a feature disposed on at least the second area of the substrate 120, at least one dimension of a feature disposed on at least the second area of the substrate 120, at least one wavelength of a radiant emission of a plasma from at least the second area of the substrate 120, at least one intensity of the radiant emission of the plasma from at least the second area of the substrate 120, or a combination thereof, and comparing the at least one characteristic of at least the first area of the substrate 120 to the at least one characteristic of at least the second area of the substrate 120 to improve detection density of the at least one characteristic of at least the second area of the substrate 120.

Operation 560 of method 600 includes repeating prior operations, operation 610, operation 620, operation 630, and/or operation 640 as needed, until measurement and analysis of the substrate 120 is complete.

Additional Considerations

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems may generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

While the various steps in an embodiment method or process are presented and described sequentially, one of ordinary skill in the art will appreciate that some or all of the steps may be executed in different order, may be combined or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward", "horizontal", "vertical", and the like do not refer to absolute directions. Instead, these terms refer to directions relative to a nonspecific plane of reference. This non-specific plane of reference may be vertical, horizontal, or other angular orientation.

The singular forms "a," "an," and "the" include plural referents, unless the context clearly dictates otherwise. Within a claim, reference to an element in the singular is not intended to mean "one and only one" unless specifically so stated, but rather "one or more." Unless specifically stated otherwise, the term "some" refers to one or more.

Embodiments of the present disclosure may suitably "comprise", "consist" or "consist essentially of" the limiting features disclosed, and may be practiced in the absence of a limiting feature not disclosed. As used here and in the appended claims, the words "comprise," "has," and "include" and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

As used, the term "determining" encompasses a wide variety of actions. For example, "determining" may include calculating, computing, processing, deriving, investigating, looking up, for example, looking up in a table, a database or another data structure, and ascertaining. Also, "determining" may include receiving, for example, receiving information, and accessing, for example, accessing data in a memory. Also, "determining" may include resolving, selecting, choosing, and establishing.

When the word "approximately" or "about" are used, this term may mean that there may be a variance in value of up to ±10%, of up to 5%, of up to 2%, of up to 1%, of up to 0.5%, of up to 0.1%, or up to 0.1%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

As used, "a CPU," "a processor," "at least one processor" or "one or more processors" generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, "a memory," "at least one memory" or "one or more memories" generally refers to a single memory configured to store data and/or instructions, multiple memories configured to collectively store data and/or instructions.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims.

What is claimed is:

1. An optical reflectometry system, comprising:
a processing chamber having a ceiling, sidewalls, and a bottom defining an internal volume, wherein the ceiling contains a transparent window;
a substrate support located in the internal volume, wherein the substrate support is configured to accept a substrate;
a light source located outside of the internal volume configured to transmit an incident light beam;
an optical fiber bundle located outside of the internal volume comprising at least a first optical fiber coupled to the light source and optically coupled to a lens assembly, wherein the lens assembly is disposed above the transparent window, and optically coupled to at least the first optical fiber, and configured to:
transmit the incident light beam, as rays of incident light, to at least one area of the substrate, through the transparent window,
receive rays of reflected light, from the at least one area of the substrate, through the transparent window, and transmit the rays of reflected light, as a reflected light beam, to the optical fiber bundle;
an optical splitter disposed within the optical fiber bundle; and
a return fiber bundle comprising at least a first return fiber coupled to the optical splitter and coupled to a detection system, wherein the detection system is configured to:
reference a reference light beam and the reflected light beam to improve a signal-to-noise ratio (SNR),
analyze a full spectrum of the reflected light beam based, in part, on the SNR, and
determine at least one characteristic of the at least one area of the substrate based upon the analysis.

2. The optical reflectometry system of claim 1, wherein the full spectrum is between about 200 nanometers (nm) to about 800 nm.

3. The optical reflectometry system of claim 1, wherein the at least one characteristic of the at least one area of the substrate comprises:
at least one height of a feature disposed the at least one area of the substrate;
at least one dimension of a feature disposed on the at least one area of the substrate;
at least one wavelength of a radiant emission of a plasma from the at least one area of the substrate;
at least one intensity of the radiant emission of the plasma from the at least one area of the substrate; or
a combination thereof.

4. The optical reflectometry system of claim 1, wherein the light source is a monochromatic light source.

5. The optical reflectometry system of claim 1, wherein the light source is a polychromatic light source.

6. The optical reflectometry system of claim 1, wherein the at least the first optical fiber is configured to:
receive a at least a sub-portion of the incident light beam from at least a first sub-area of the light source;
transmit at least the sub-portion of the incident light beam;
receive at least the sub-portion of the reflected light beam; and
transmit at least the sub-portion of the reflected light beam.

7. The optical reflectometry system of claim 1, wherein the at least the first optical fiber has a diameter between about 0.1 millimeters (mm) and about 0.5 mm.

8. The optical reflectometry system of claim 1, wherein an area, of the at least one area of the substrate, has a substrate image size with a diameter between about 0.1 millimeters (mm) and about 10 mm.

9. The optical reflectometry system of claim 1, wherein at least the first return fiber is configured to:
receive at least a sub-portion of the reference light beam;
transmit at least the sub-portion of the reference light beam;
receive at least a first sub-portion of the reflected light beam; and
transmit at least the sub-portion of the reflected light beam.

10. The optical reflectometry system of claim 1, wherein the optical splitter is configured to:
receive a at least a sub-portion of the incident light beam from the at least the first optical fiber;
divide at least the sub-portion of the incident light beam into at least a first sub-portion of incident light of and at least a second sub-portion of incident light;
transmit the at least the first sub-portion of incident light to at least the first optical fiber;
transmit at least the second sub-portion of incident light to at least the first return fiber as at least a sub-portion of the reference light beam,
receive at least the sub-portion of the reflected light beam; and
transmit at least the sub-portion of the reflected light beam to at least a second return fiber.

11. The optical reflectometry system of claim 1, wherein the lens assembly comprises at least one focusing lens, and the lens assembly is configured to:
receive at least a first sub-portion of incident light from the at least the first optical fiber;
focus the at least a first sub-portion of incident light to at least one area of the substrate;
receive rays of reflected light from at least one area of the substrate; and
transmit rays of reflected light as at least a first sub-portion of the reflected light beam to the at least the first optical fiber.

12. The optical reflectometry system of claim 11, wherein the at least a first area of the substrate has substrate image size diameter between about 0.1 mm and 10 mm.

13. The optical reflectometry system of claim 1, wherein the detection system comprises a spectroscopic reflectometry system is further configured to:
receive at least a sub-portion of the reference light beam, wherein at least the sub-portion of the reference light beam corresponds to at least a first sub-area of the light source; and
receive at least a sub-portion of the reflected light beam, wherein at least the sub-portion of the reflected light beam corresponds to at least the first sub-area of the light source.

14. A method of optical reflectometry, comprising:
transmitting, via an optical fiber bundle comprising at least a first optical fiber, an incident light beam from a light source to an optical splitter;
transmitting a first portion of the incident light beam, via the optical fiber bundle, from the optical splitter to a lens assembly;
transmitting a second portion of the incident light beam as a reference light beam, via a return fiber bundle comprising at least one return fiber, from the optical splitter to a detection system;

focusing the first portion of the incident light beam as rays of incident light from the lens assembly upon at least one area of a substrate disposed within a processing chamber;
receiving rays of reflected light from the at least one area of the substrate at the lens assembly;
transmitting the rays of reflected light as a reflected light beam from the lens assembly, via the optical fiber bundle, to the optical splitter;
transmitting the reflected light beam from the optical splitter, via the return fiber bundle, to the detection system;
referencing the reference light beam to the reflected light beam to improve a signal-to-noise ratio (SNR);
analyzing a full spectrum of the reflected light beam based, in part, on the improved SNR; and
determining at least one characteristic of the at least one area of the substrate upon the analysis.

15. The method of claim 14, wherein transmitting the incident light beam from the light source to the optical splitter further comprises:
transmitting at least a sub-portion of the incident light beam from at least a first sub-area of the light source to the at least the first optical fiber; and
receiving the at least a sub-portion of the incident light beam at the optical splitter from the at least the first optical fiber.

16. The method of claim 14, wherein transmitting the first portion of the incident light beam from the optical splitter to the lens assembly further comprises:
dividing at least a sub-portion of the incident light beam into at least a first sub-portion of incident light, wherein the at least a first sub-portion of incident light corresponds to the at least a first sub-area of the light source; and
returning the at least the first sub-portion of incident light from the optical splitter to the at least the first optical fiber; and
transmitting the at least a first sub-portion of incident light from the at least the first optical fiber to the lens assembly.

17. The method of claim 14, wherein transmitting the second portion of the incident light beam as the reference light beam from the optical splitter to the detection system further comprises:
dividing at least a sub-portion of the incident light beam into at least a second sub-portion of incident light wherein the at least a second sub-portion of incident light corresponds to the at least a first sub-area of the light source;
transmitting the at least a second sub-portion of incident light from the optical splitter to the at least a first return fiber as at least a first sub-portion of the reference light beam; and
receiving the at least a first sub-portion of the reference light beam from at least the first return fiber at the detection system, wherein the at least a first sub-portion of the reference light beam corresponds to the at least a first sub-area of the light source.

18. The method of claim 14, wherein focusing the first portion of the incident light beam as rays of incident light from the lens assembly upon at least one area of a substrate disposed within a processing chamber further comprises:
receiving, via the optical fiber bundle, at least a first sub-portion of the incident light beam from the optical splitter; and
focusing the at least a first sub-portion of the incident light beam as rays of incident light from the lens assembly to at least at least one area of the substrate.

19. The method of claim 14, wherein transmitting the rays of reflected light as the reflected light beam from the lens assembly, via the optical fiber bundle, to the optical splitter further comprises:
receiving, from at least one area of the substrate, rays of reflected light at the lens assembly; and
transmitting the rays of reflected light, as at least a first sub-portion of the reflected light beam, from the lens assembly to at least the first optical fiber.

20. The method of claim 14, wherein referencing the reference light beam to the reflected light beam to improve the signal-to-noise ratio further comprises:
receiving at least a first sub-portion of the reference light beam, wherein the at least a first sub-portion of the reference light beam corresponds to the at least a first sub-area of the light source;
receiving at least a first sub-portion of the reflected light beam, wherein at least the first sub-portion of the reflected light beam, corresponds to at least a first sub-portion of incident light, wherein the at least a first sub-portion of incident light corresponds to the at least the first sub-area of the light source; and
referencing the first sub-portion of the reference light beam to the first sub-portion of the reflected light beam to improve a first signal-to-noise ratio (SNR).

21. The method of claim 14, wherein analyzing a full spectrum of the reflected light beam based, in part, on the improved SNR, further comprises:
analyzing a full spectrum of at least a first sub-portion of the reflected light beam based, in part, on a first signal-to-noise ratio (SNR), wherein the full spectrum is between about 200 nanometers (nm) to about 800 nm.

22. The method of claim 14, wherein determining at least one characteristic of the at least one area of the substrate further comprises:
determining, based upon a first signal-to-noise ratio (SNR) and analyzing a full spectrum of the reflected light beam:
at least one height of a feature disposed on the at least one area of the substrate;
at least one dimension of a feature disposed the at least one area of the substrate;
at least one wavelength of a radiant emission of a plasma from the at least one area of the substrate;
at least one intensity of the radiant emission of the plasma from the at least one area of the substrate; or
a combination thereof.

23. The method of claim 14, wherein referencing the reference light beam to the reflected light beam to improve the signal-to-noise ratio (SNR) further comprises:
receiving at least a first sub-portion of the reference light beam, wherein the at least a first sub-portion of a reference light beam corresponds to at least a first sub-area of the light source;
receiving at least a second sub-portion of the reference light beam, wherein the at least a second sub-portion of the reference light beam corresponds to at least a second sub-area of the light source;
receiving at least a first sub-portion of the reflected light beam from at least a first area of the substrate, wherein at least the first sub-portion of the reflected light beam, corresponds to at least a first sub-portion of incident light, wherein the at least a first sub-portion of incident light corresponds to the at least the first sub-area of the light source;
receiving at least a second sub-portion of the reflected light beam from at least a second area of the substrate, wherein at least the second sub-portion of the reflected light beam, corresponds to at least a second sub-portion of incident light, wherein the at least a second sub-portion of incident light corresponds to the at least the second sub-area of the light source;
referencing the first sub-portion of the reference light beam to the first sub-portion of the reflected light beam to improve a first SNR; and
referencing the second sub-portion of the reference light beam to the second sub-portion of the reflected light beam to improve a second SNR.

24. The method of claim 14, wherein analyzing a full spectrum of the reflected light beam based, in part, on the improved SNR, further comprises:
analyzing a full spectrum of at least a first sub-portion of the reflected light beam based, in part, on a first signal-to-noise ratio (SNR), wherein the full spectrum is between about 200 nanometers (nm) to about 800 nm; and
analyzing a full spectrum of at least a second sub-portion of the reflected light beam based, in part, on a second SNR, wherein the full spectrum is between about 200 nanometers (nm) to about 800 nm.

25. The method of claim 14, wherein determining at least one characteristic of the at least one area of the substrate based upon the analysis further comprises:
determining at least one characteristic at least a first area of the substrate based upon an improved first SNR, and analyzing a full spectrum of at least a first sub-portion of the reflected light beam, wherein determining the at least one characteristic further comprises determining:
at least one height of a feature disposed on at least the first area of the substrate;
at least one dimension of a feature disposed on at least the first area of the substrate;
at least one wavelength of a radiant emission of a plasma from at least the first area of the substrate;
at least one intensity of the radiant emission of the plasma from at least the first area of the substrate; or
a combination thereof;
determining at least one characteristic at least a second area of the substrate based upon an improved second SNR, and analyzing a full spectrum of at least a second sub-portion of the reflected light beam, wherein determining the at least one characteristic further comprises determining:
at least one height of a feature disposed on at least the second area of the substrate;
at least one dimension of a feature disposed on at least the second area of the substrate;
at least one wavelength of a radiant emission of a plasma from at least the second area of the substrate;
at least one intensity of the radiant emission of the plasma from at least the second area of the substrate; or
a combination thereof; and
comparing the at least one characteristic of at least the first area of the substrate to the at least one characteristic of at least the second area of the substrate to improve detection density of the at least one characteristic of at least the second area of the substrate.

* * * * *